(12) United States Patent
Hesse

(10) Patent No.: US 6,946,745 B2
(45) Date of Patent: Sep. 20, 2005

(54) METHOD AND COMPONENTS FOR FLIP-CHIP BONDING

(75) Inventor: Hans Hesse, Paderborn (DE)

(73) Assignee: Hesse & Knipps GmbH, Paderborn (DE)

( * ) Notice: Subject to any disclaimer, the term of this patent is extended or adjusted under 35 U.S.C. 154(b) by 236 days.

(21) Appl. No.: 10/340,863

(22) Filed: Jan. 10, 2003

(65) Prior Publication Data

US 2003/0151145 A1 Aug. 14, 2003

(30) Foreign Application Priority Data

Jan. 11, 2002 (DE) .......................................... 102 01 004
Mar. 7, 2002 (DE) .......................................... 102 09 915

(51) Int. Cl.[7] .......................... H01L 23/48; H01L 23/52; H01L 29/40
(52) U.S. Cl. ........................ 257/783; 257/778; 438/108; 438/119
(58) Field of Search ................................ 257/778, 773; 438/108, 119

(56) References Cited

U.S. PATENT DOCUMENTS

| | | | |
|---|---|---|---|
| 3,657,610 A | | 4/1972 | Yamamoto et al. |
| 5,386,624 A | | 2/1995 | George et al. |
| 5,523,628 A | * | 6/1996 | Williams et al. ............ 257/777 |
| 5,841,192 A | * | 11/1998 | Exposito ..................... 257/701 |
| 6,399,178 B1 | | 6/2002 | Chung |
| 2003/0129488 A1 | * | 7/2003 | Gross ......................... 429/185 |

FOREIGN PATENT DOCUMENTS

| | | |
|---|---|---|
| DE | 4105 869 | 8/1992 |
| DE | 19527661 | 1/1997 |
| DE | 10020374 | 1/2001 |
| EP | 0 841 700 | 5/1988 |
| EP | 0 982 385 | 3/2000 |
| WO | WO 99 04 430 | 1/1999 |
| WO | WO 99 56509 | 11/1999 |
| WO | WO 00 34 032 | 6/2000 |

OTHER PUBLICATIONS

Patent Abstracts JP 10 335527—Dec. 18, 1998.
Patent Abstracts JP 61 005549—Jan. 11, 1986.
Patent Abstracts JP 04 030544—Feb. 3, 1992.
"Application Specific Flip Chip Packages:Considerations and Options in Using FCIP", Paul Mescher, publ.in Pan Pacific Microelectronics Symposium Conference, Jan. 2000, 13 pages.

* cited by examiner

*Primary Examiner*—Nathan J. Flynn
*Assistant Examiner*—Victor A. Mandala, Jr.
(74) *Attorney, Agent, or Firm*—Hebert Dubno

(57) ABSTRACT

In the forms of a flip-chip package in which the contact elements of the chip are ultrasonically welded to the contact elements of the substrate, either the chip or the substrate or both are provided, prior to juxtaposition, with a bonding material which can be ultrasonically activated. During the ultrasonic welding process in which the contact elements of the chip and substrate are bonded together, the bonding material provides an additional attachment between the chip and substrate and eliminates the need for underfilling.

16 Claims, 2 Drawing Sheets

METHOD AND COMPONENTS FOR FLIP-CHIP BONDING

FIELD OF THE INVENTION

My present invention relates to a flip-chip packaging and, more particularly, to a joining of a flip chip with a substrate. The invention especially relates to a method of producing the electrically-conducting connections between a chip with multiple contact elements or contact surfaces and a substrate with contact elements, especially by means of ultrasonic energy to weld the projecting contact elements of the chip to the substrate. The invention also relates to components for that purpose and to the assembly or package which is fabricated by that method.

BACKGROUND OF THE INVENTION

In flip-chip bonding, the contact elements on the contact surfaces or the bond paths have a typical height of 15 μm to 75 μm and are produced in the form of stud bumps, solder bumps or by the "plating process." For the ultrasonic flip-chip bonding primarily stud bumps and contact elements in accordance with the "plating process" are used. The space or gap remaining after the bonding between the substrate and the silicon for the chip amounts usually to 50% to 70% of the starting gap dimension. So that forces between the substrate and the chip, which can arise because of the different thermal expansion coefficients of the substrate and the chip ("thermal mismatch") can be taken up (the shear stress would otherwise loosen the chip from the substrate), it is known to introduce with a very fine needle between the chip and the substrate an additional adhesive subsequent to the bonding to increase the mechanical stability of the entire assembly. This process is characterized as underfilling or underfill.

Especially with very small distances between the chip and substrate and a small space (pitch) between the individual contact elements, this underfill process can no longer be used since the remaining gap does not allow a homogeneous underfilling with adhesive.

OBJECTS OF THE INVENTION

It is the principal object of the present invention to provide a method of making a flip-chip package without the underfill or the step of underfilling.

Another object of this invention is to provide a chip or substrate or assembly thereof with which secure fastening between the chip and its carrier, i.e. the substrate can be obtained so that thermal mismatch can be resisted without need for underfilling.

Still another object of the invention is a method of mounting a chip on a substrate whereby all of the advantages of ultrasonic bonding of the contact elements can be obtained and a particularly secure connection can be assured without underfill.

SUMMARY OF THE INVENTION

This object is achieved in that on the side of the chip turned toward the substrate, between the contact elements and especially on the free chip surface and/or on the side of the substrate turned toward the chip between the contact surface and especially the residual surfaces which are covered by the chip, at least regionally, a bonding material is provided.

The objects are further achieved in that by means of the bonding material between the contact elements of the flip-chip and/or between the contact areas of the substrate, a further bond between the substrate and the flip-chip is produced.

The bonding material thus serves to produce a reliable bond between the chip and the substrate withstanding the shear stresses so as to insure that with thermal loading of the assembly, a release of the chip or a breaking of the electrical contacts is avoided.

The bonding material can in one embodiment be preferably nonconducting and has independently from this requirement characteristics which allow the bonding material to function for example as an adhesive, especially a two component adhesive or also as an ultrasonic weld material, for example, an ultrasonically weldable plastic. In another embodiment the bonding material can be electrically conductive and an electrically conductive bond can be formed between the chip or the electrical circuitry provided thereon and the substrate (for example surfaces for ground and voltage supply).

The bonding material can be supplementarily applied to the above-mentioned surface of a chip or a substrate, preferably simultaneously with the fabrication process for the chip or the substrate. This can be done by conventional process steps during the fabrication of the chip or substrate, for example, by a lithographic process, by means of the thin layer technique, the etching technique or another fabrication method known to the artisan.

The special advantage of such a construction in which a bonding material is applied to one or the other element (chip/substrate) before the bonding itself lies in that the bonding material is already located between the two elements to be bonded at the time bonding is required and thus does not have to be underfilled between the bond partners. In addition, the spacing between the contact elements or between the chip and the substrate can be as small as desired. The method step of underfilling is then eliminated along with the cost so that the cycling time can be reduced.

Aside from the alternative whereby the bonding material is applied to the substrate prior to the bonding, preferably the bonding, material prior to bonding is also applied to the side of the flip-chip which is turned toward the substrate on bonding. Ideally, the bonding material is provided on the chip at the time of manufacture.

The bonding material can be so applied that its height over the chip base surface is slightly less than the heights of the contact elements of the chip. The height can amount to, for example, 5 to 9 micrometers when the contact elements have heights of at least 15 micrometers. This has the advantage that during the bonding process steps, initially, the end surfaces of the contact elements of the chip will come into contact with the corresponding contact surfaces of the substrate so that initially there is a concentration of the ultrasonic energy on these parts.

The reduced height of the bonding material by comparison to the contact elements of the chip can also be realized when the bonding material is applied to the substrate rather than the flip-chip according to the first alternative. In this case, the bonding material on the substrate can project beyond the contact pads and especially can have a height which is less than the height of the contact elements of the chip applied to the substrate to achieve the above mentioned advantage.

By applying a pressing force and an ultrasonic excitation, an electric connection can then be produced between the flip-chip and substrate, whereby the contact elements deform and are pressed together. This reduces the spacing between the flip-chip and the substrate so that then the bonding material will first contact the substrate or a further bonding material layer on the substrate.

It can be provided that already during the contact a solid bond can be effected between the flip-chip and the substrate, for example, by an adhesive effect between the bonding material and the substrate or by an adhesive effect between the respective bonding material on the chip and the substrate which can form a two component adhesive.

Alternatively, it can be provided that a reliable connection between the chip and substrate is obtained first after an ultrasonic welding of the bonding material with the juxtaposed partner element (substrate, chip or further bonding material). In this case the complete bonding process is, for example, two staged, whereby in the first stage, the electrically conductive ultrasonic bonding between contact elements and surfaces [pads] is produced and then the additional bonding is brought about. It is possible to carry out the two stages simultaneously.

With the sequence of the welding in stages which follow one another in time, it can be provided that the welding of the bonding material is effected with other welding parameters, especially at other ultrasonic frequencies and/or with other pressures than the welding of the contact elements. Thus for each process step the optimum welding parameters can be chosen.

In a further feature of the invention, it can be provided that the bonding material, whether applied on the chip or the substrate, has recesses in the material, especially in the form of channels or grooves. These recesses or channels/grooves serve to take up material, for example, whether of the contact elements or for example of the bonding material which is pressed out during the bonding. This pressed out material finds place in the recesses/channels without creating false electrical connections.

The bonding material can be applied area-wide or also only at point locations between the contact elements (chip) or contact pads (substrate). With an area-wide arrangement it is preferably that the contact material surround the contact elements or contact surfaces especially with a clearance.

Because of the presence of the preferred spacing, again a region or channel is formed which surrounds the contact surface or contact element and thus serves to receive material of the contact element or the bonding material in a stress free and force free manner upon the pressing or deformation during bonding. These regions/channels can also form an insulation between the contact elements/contact surfaces and the bonding material, especially when the bonding material is formed as an electrically conductive material so as to avoid undesirable short circuiting between the contact elements/surfaces and the bonding material.

Especially in an alternative configuration of the bonding material as an electrically conductive material, it is possible using the bonding material in a very simple manner to provide at least in regions a surface electric connection between the substrate and chip or the electronic circuitry thereon. Such a surface connection with multiple independent contacts can, for example, be used to supply one or more supply voltages or also a ground potential. In this manner the known requirements, precisely for high power chips which require a number of contact elements to be supplied with voltage or ground, can be satisfied.

Such conductive bonding materials to create electric connections between the chip and substrate can be applied in optional patterns to the chip or substrate, for example, it can extend as a meandering connection between the contact elements and surfaces.

Furthermore, the contact elements or surfaces of the chip or substrate can be replaced by the bonding material especially where the electric contacts are prepared for voltage supply and the application of a ground potential.

The invention thus comprises, inter alia a component adapted to form part of a flip-chip assembly upon welding of a chip member having conductive elements to a substrate member having conductive elements bonded to the conductive elements of the chip, the component comprising one of the members formed with a bonding material on a surface juxtaposable with the other of the members and adapted to bond the members together over at least a part of the surface and mechanically supplementing a bond between the conductive elements to hold the members together without underfilling.

The bonding material may be provided on one or both of these members, may be ultrasonically activatable as has been noted, may be electrically conductive or nonconductive and generally surrounds the contact elements with clearance so that during the ultrasonic welding, when the chip is applied to the substrate under pressure, material of the contact elements or the bonding material may extrude into the clearance around a contact element.

The invention also includes a flip-chip assembly which can comprise:

a chip formed with a surface and contact elements projecting from the surface;

a substrate having a surface juxtaposed with the surface of the chip and having contact elements engageable by the contact elements of the chip and ultrasonically weldable thereto; and a layer of an ultrasonically activatable bonding material on at least one of the surfaces prior to juxtaposition of the surfaces for bonding the surfaces together without underfill.

The method of the invention may comprise a method of connecting a chip having contact elements projecting from a surface with a substrate having contact elements to be bonded to those of the chip. The method may then comprise the steps of (a) prior to juxtaposition of the surfaces, applying to at least one of the surfaces at least over at least part of an area thereof a bonding material;

(b) juxtaposing the surfaces with the contact elements of the chip in contact with the contact elements of the substrate and with the bonding material interposed between the surfaces;

(c) ultrasonically welding the contact elements of the chip to the contact elements of the substrate; and (d) additionally bonding the chip to the substrate with the bonding material between the surfaces.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
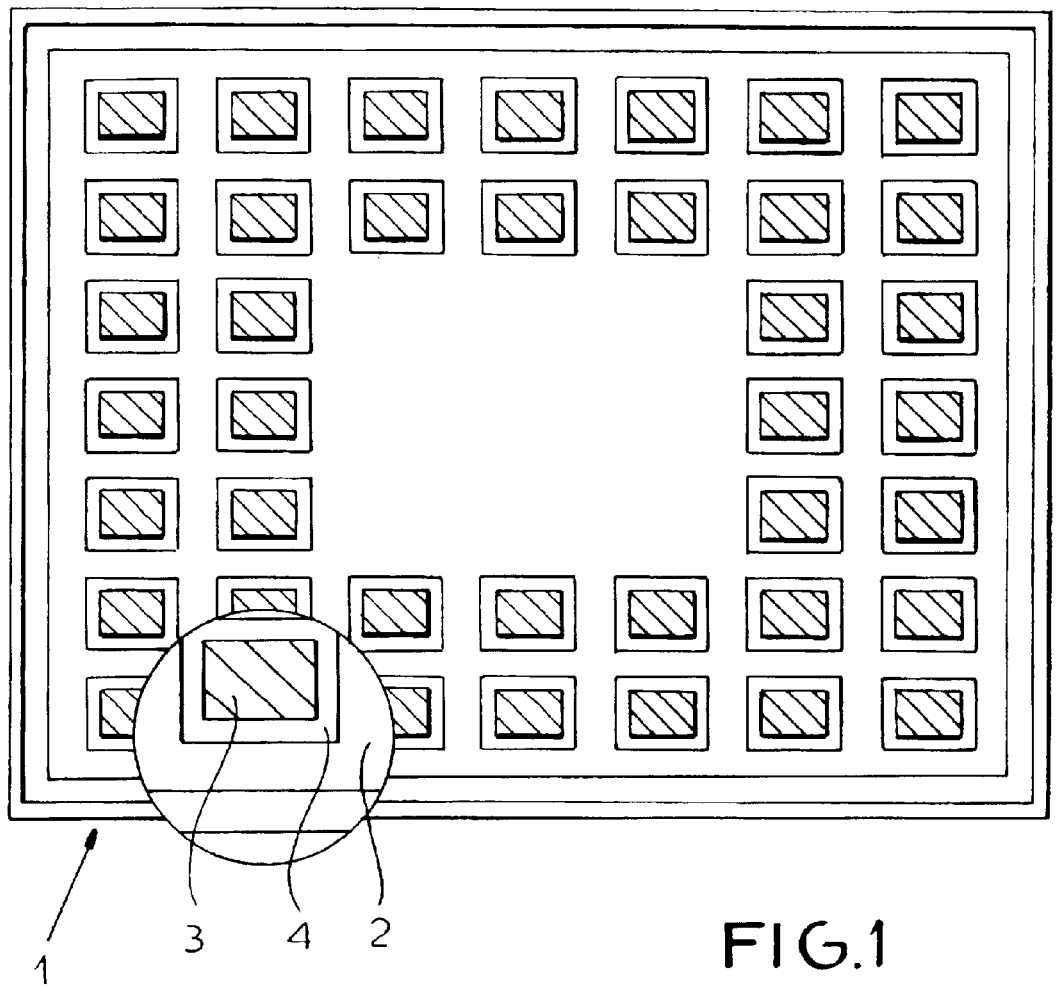
FIG. 1 is a diagrammatic plan view and underside of a flip chip with a portion thereof drawn to an enlarged scale.
Figure 2:
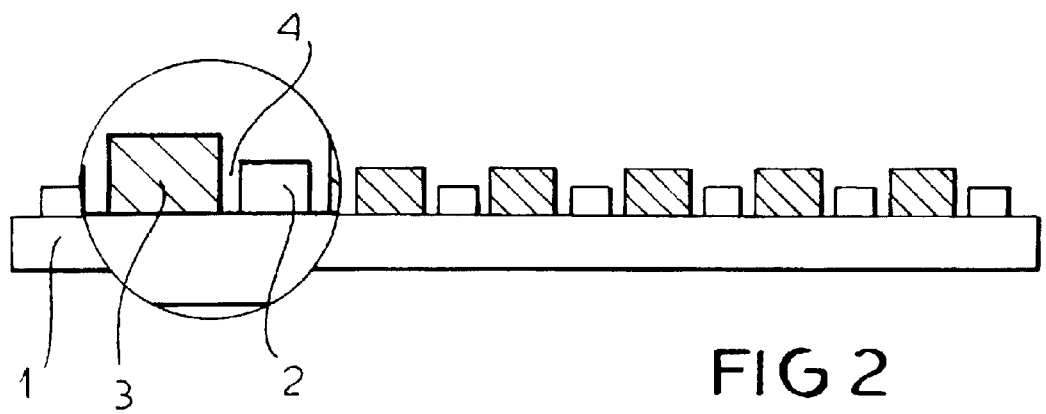
FIG. 2 is a diagrammatic section through that flip chip also with a portion enlarged.

FIGS. 1 and 2 show that, as a replacement for the underfill between the chip one and a substrate which has not been illustrated, a bonding material 2, for example an ultrasonically weldable synthetic resin is used especially in the bond region between the contact elements 3 (bond pads).

Alternatively thereto an adhesive, especially a two component adhesive, can be used which is applied to both bonding partners in a bone-dry manner so that dust will not adhere thereto and whose adhesive effect is first initiated when both sides are brought into contact, i.e. when the metallic contact elements 3 are correspondingly deformed. The bonding material can also be an ultrasonic weldable plastic coating which can be used as the last mask in the wafer process.

In the present embodiment, the bonding material 2 is applied over a wide area between the contact elements 3. Between the contact elements 3 and the bonding material 2, intervening spaces 4 or channels 4 are left so that, upon welding with ultrasound, place for deformed material both of the contact elements 3 and also of the bonding material 2 remains and which upon welding is plastically deformed and laterally spread.

It is advantageous when, in the fabrication of the wafer additional material as the bonding material 2 is applied by the "plating" so that the "underfill" process step is superfluous and the mechanical stability of the bond between the chip and substrate is achieved either by the effect of the ultrasound or through a chemical process and which, after producing the electrically conductive connection, that is after deformation of the contact element, results in a full surface contact.

With ultrasonic welding, initially the electrical contacts are formed and then the adhesive bonding with welding as a consequence of the fact that the adhesive material 2 has a lesser height than the contact elements 3. In the invention it is further provided that upon producing the electrical contacts and than the additional bonding, different ultrasound energies and/or ultrasound frequencies can be used. By contrast with the use of anisotropic conductive adhesives, the process of the invention has the advantage that the bond is lower ohmic since no randomly oriented silver particles are required as current tracks but the bonding material can provide a direct contact between the chip and substrate.

In addition, the method of the invention can be used for small contact spacings or pitches whereas with anisotropic conductive adhesive, smallest mean path lengths must be maintained in order to insure insulation.

Figure 3:
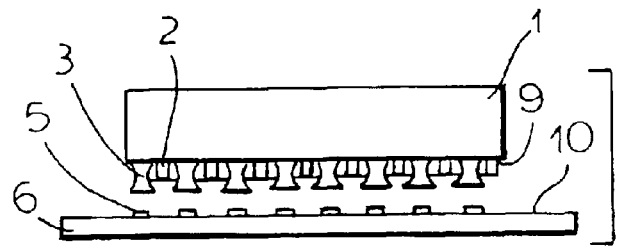
FIG. 3 is a cross section showing the flip chip and the substrate prior to assembly.
Figure 4:
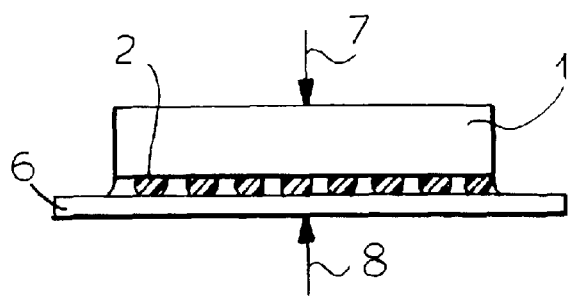
FIG. 4 is a view similar to the FIG. 3 showing the assembly operation and the application of ultrasonic energy.

As can be seen from FIG. 3, the contact elements 3 of the chip 1 can be juxtaposed with contact elements 5 of the substrate 6 and are surrounded by the bonding material 2 which leaves a clearance around the contact elements. When the chip 1 is pressed against the substrate 6 as shown in FIG. 4 and the ultrasonic energy is applied as represented by the arrow 7 and 8, the contact elements 3 and 5 are bonded together and the bonding material 2 is activated to bond the surface 9 of the chip 1 to the surface 10 of the substrate 6. In spite of the fact between the surfaces 9 and 10 can be very small, it can essentially be filled by bonding material which acts as an adhesive to secure the chip to the substrate so that underfill is not required and the underfilling step is eliminated.

Figure 5:
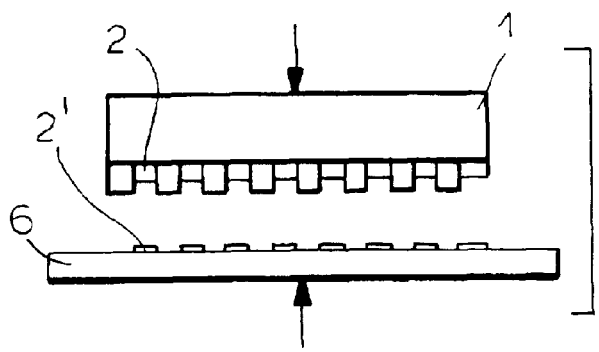
FIG. 5 is a view similar to FIG. 3 of another embodiment.

In FIG. 5, it can be seen that portions 2 and 2' of the bonding material are provided on the juxtaposed surfaces of the chip 1 and the substrate 6 and may be parts of a two-component adhesive which, when they meet, securely attach the chip to the substrate.

Figure 6:
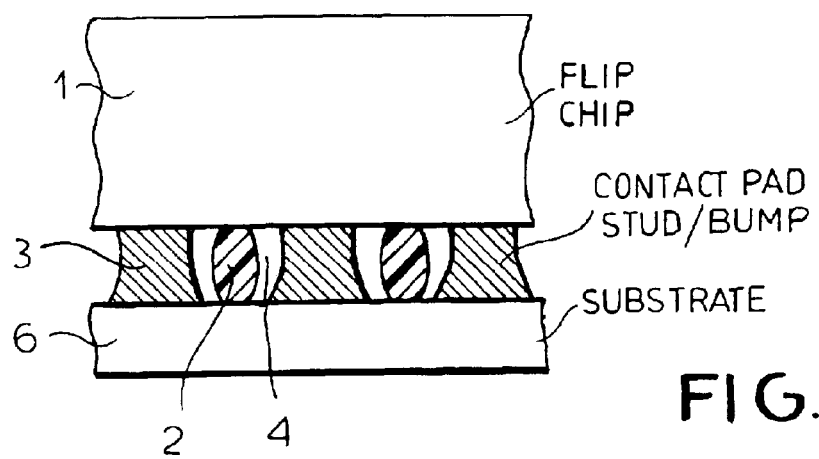
FIG. 6 is a fragmentary cross sectional view of the assembly.

In FIG. 6 the flip chip 1 is shown to be joined to the substrate 6 and both the contact elements 3 and the bonding material 2 have spread somewhat to at least partially fill the clearances 4 around the contact elements.

I claim:

1. A component adapted to form part of a flip-chip assembly upon welding of a chip member having conductive elements to a substrate member having conductive elements bonded to the conductive elements of the chip, said component comprising one of said members formed with a bonding material on a surface juxtaposable with the other of said members and adapted to bond said members together over at least a part of said surface and mechanically supplementing a bond between said conductive elements to hold said members together without underfilling, said contact elements of said chip member projecting away from the chip member and said bonding material being of a height less than the height of said contact elements of said chip member.

2. The component defined in claim 1 wherein said bonding material is provided on said surface with openings forming channels and grooves in said bonding material.

3. The component defined in claim 2 wherein said channels are formed around the contact elements on said surface and of a width sufficient to receive material spreading from said contact elements and said bonding material upon welding of said members together.

4. The component defined in claim 1 wherein said bonding material is an electrically nonconductive synthetic resin.

5. The component defined in claim 1 wherein said bonding material is capable of bonding to bonding material provided on the other member.

6. The component defined in claim 1 wherein said bonding material is at least part of a two-part adhesive.

7. A component adapted to form part of a flip-chip assembly upon welding of a chip member having conductive elements to a substrate member having conductive elements bonded to the conductive elements of the chip, said component comprising one of said members formed with a bonding material on a surface juxtaposable with the other of said members and adapted to bond said members together over at least a part of said surface and mechanically supplementing a bond between said conductive elements to hold said members together without underfilling, said bonding material being an electrically conductive synthetic resin.

8. A component adapted to form part of a flip-chip assembly upon welding of a chin member having conductive elements to a substrate member having conductive elements bonded to the conductive elements of the chip, said component comprising one of said members formed with a bonding material on a surface juxtaposable with the other of said members and adapted to bond said members together over at least a part of said surface and mechanically supplementing a bond between said conductive elements to hold said members together without underfilling, said bonding material being an ultrasonically weldable material.

9. A flip-chip assembly comprising:
   a chip formed with a surface and contact elements projecting from said surface;
   a substrate having a surface juxtaposed with the surface of said chip and having contact elements engageable by the contact elements of said chip and ultrasonically weldable thereto; and a layer of an ultrasonically activatable bonding material on at least one of said surfaces prior to juxtaposition of said surfaces for bonding said surfaces together without underfill, said layer being of a height less than the height of the contact elements of the chip.

10. The flip-chip assembly defined in claim 9 wherein said bonding material surrounds the contact elements with clearance.

11. The flip-chip assembly defined in claim 9 wherein said bonding material at least in regions thereof forms an electrically nonconducting or conducting laminar connection between chip and substrate.

12. The flip-chip assembly defined in claim 9 wherein a portion of said bonding material is provided on each of said surfaces prior to juxtaposition thereof.

13. The flip-chip assembly defined in claim 12 wherein said bonding material is a two-component adhesive.

14. A method of connecting a chip having contact elements projecting from a surface with a substrate having contact elements on a surface to be bonded to the surface of the chip, said method comprising the steps of:

(a) prior to juxtaposition of said surfaces, applying to at least one of said surfaces at least over at least part of an area thereof a bonding material;

(b) juxtaposing said surfaces with the contact elements of said chip in contact with the contact elements of said substrate and with said bonding material interposed between said surfaces;

(c) ultrasonically welding the contact elements of said chip to the contact elements of said substrate; and (d) additionally bonding said chip to said substrate with said bonding material between said surfaces, the bonding material being ultrasonically welded between said surfaces, the ultrasonic welding of said contact elements is carried out with different ultrasonic welding parameters than the ultrasonic welding of said bonding material.

15. The method defined in claim 14 wherein said bonding material surrounds said contact elements with a clearance and portions of the contact elements and bonding material are pressed into said clearances upon bonding of the chip to the substrate.

16. The method defined in claim 14, further comprising the step of forming a laminar electrical connection at least in a selected region between said chip and said substrate with said bonding material.

* * * * *